United States Patent
Nagano et al.

(10) Patent No.: US 7,572,674 B2
(45) Date of Patent: Aug. 11, 2009

(54) METHOD FOR MANUFACTURING SEMICONDUCTOR DEVICE

(75) Inventors: Kouta Nagano, Tsuchiura (JP); Hideo Miura, Tsuchiura (JP); Akihiro Yaguchi, Tsuchiura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/519,175

(22) PCT Filed: Sep. 26, 2002

(86) PCT No.: PCT/JP02/09975

§ 371 (c)(1),
(2), (4) Date: Dec. 20, 2004

(87) PCT Pub. No.: WO2004/030075

PCT Pub. Date: Apr. 8, 2004

(65) Prior Publication Data

US 2005/0227384 A1    Oct. 13, 2005

(51) Int. Cl.
*H01L 21/48* (2006.01)
*H01L 23/495* (2006.01)
(52) U.S. Cl. .................................. 438/114; 257/673
(58) Field of Classification Search ................ 438/124, 438/110, 106, 114, 123; 349/187; 257/673; 174/264
See application file for complete search history.

(56) References Cited

U.S. PATENT DOCUMENTS

| 6,084,653 | A  | * | 7/2000  | Shimada et al. | 349/187 |
| 6,331,450 | B1 | * | 12/2001 | Uemura         | 438/114 |
| 6,576,496 | B1 | * | 6/2003  | Bolken et al.  | 438/110 |
| 6,610,934 | B2 | * | 8/2003  | Yamaguchi et al. | 174/264 |
| 6,774,466 | B1 | * | 8/2004  | Kajiwara et al. | 257/673 |

FOREIGN PATENT DOCUMENTS

| JP | 2000-150582 | A |   | 5/2000 |
| JP | 2002-009111 | A |   | 1/2002 |
| JP | 2002009111  | A | * | 1/2002 |

OTHER PUBLICATIONS

Japan Patent Office (JPO) office action for patent application JP2004-539440 (May 20, 2008).

* cited by examiner

*Primary Examiner*—Calvin Lee
(74) *Attorney, Agent, or Firm*—Townsend and Townsend and Crew LLP

(57) ABSTRACT

In a production of a semiconductor device, after a step in which a thermosetting resin is thermally cured to seal a semiconductor chip with the resin and before a step in which a characteristic of the semiconductor chip is inspected, the thermosetting resin is baked at a temperature higher than the resin sealing temperature in said resin sealing step.

8 Claims, 13 Drawing Sheets

FIG.5
(a) 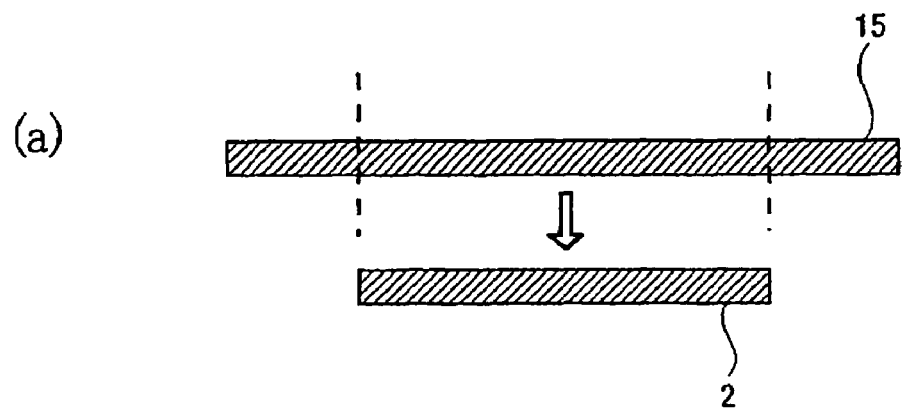
(b) 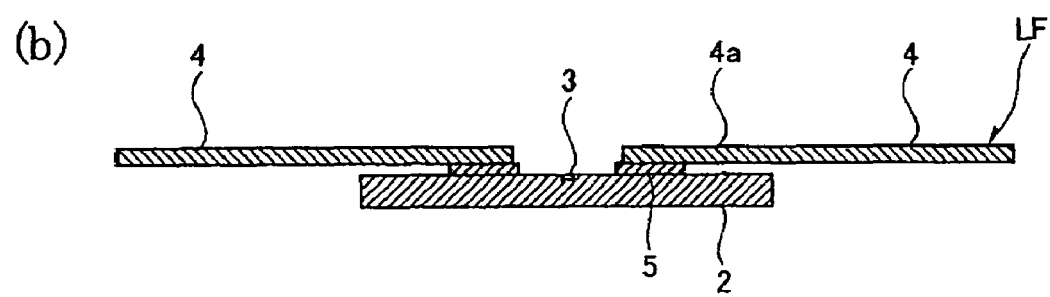
(c) 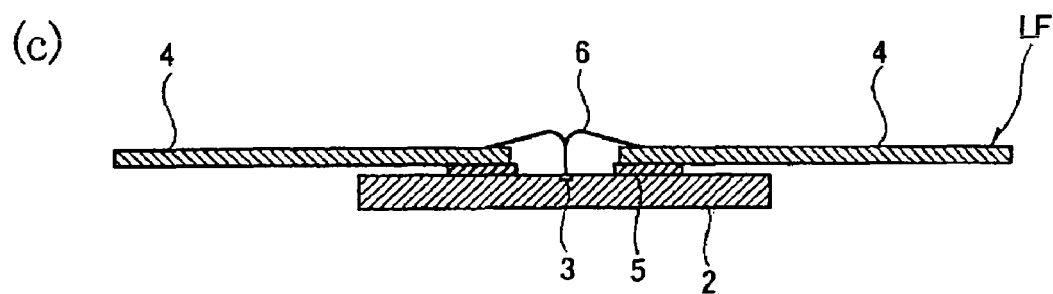
(d) 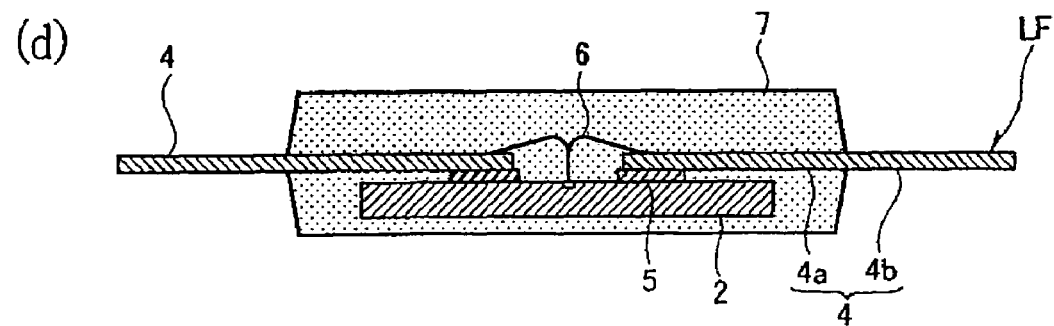

FIG.6
(a)
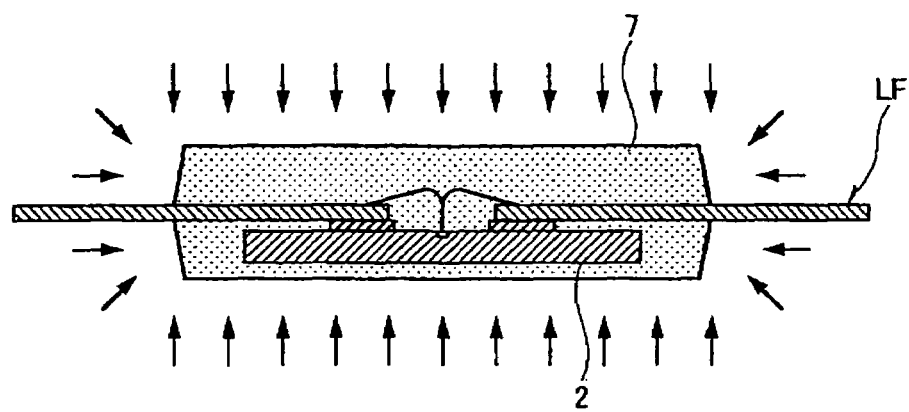
(b)
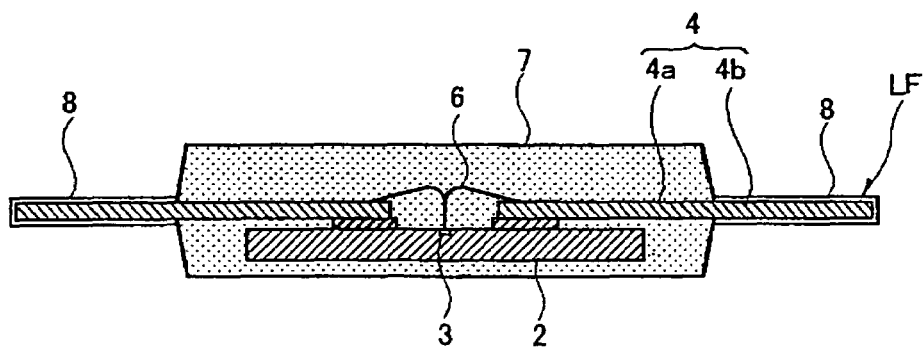
(c)
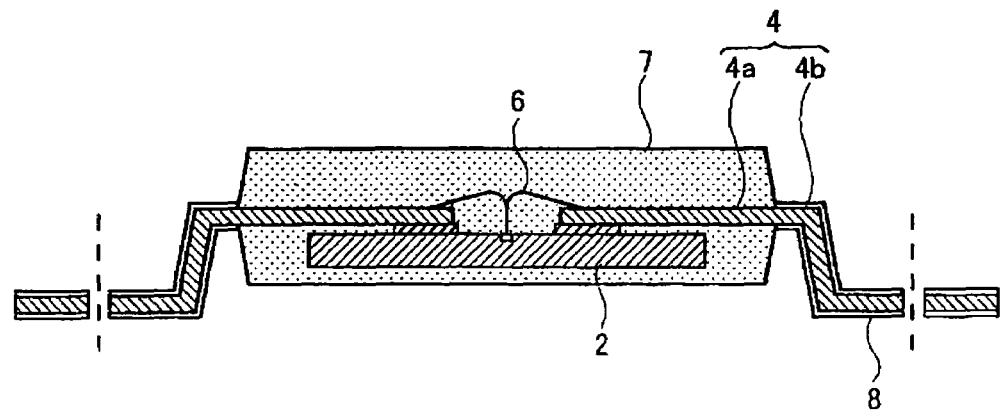

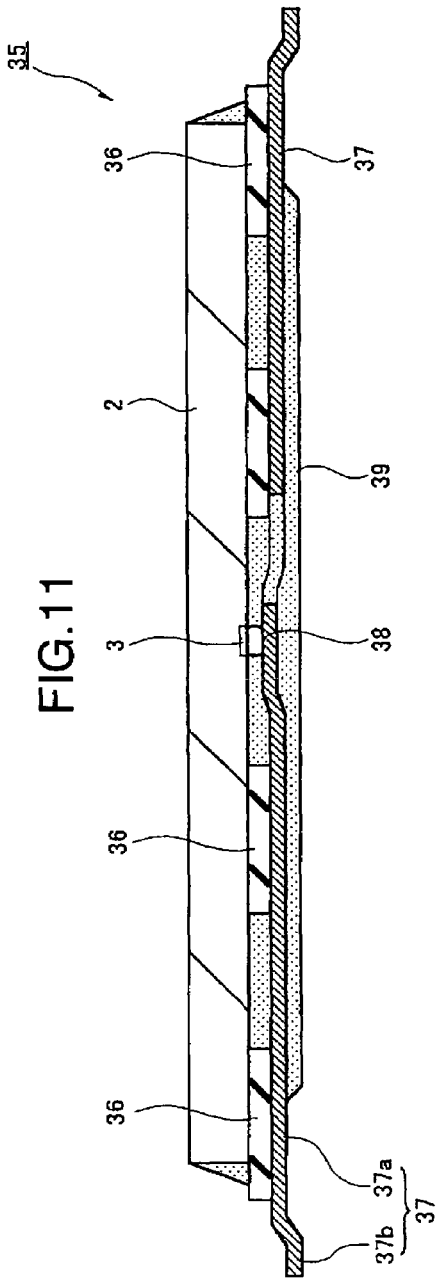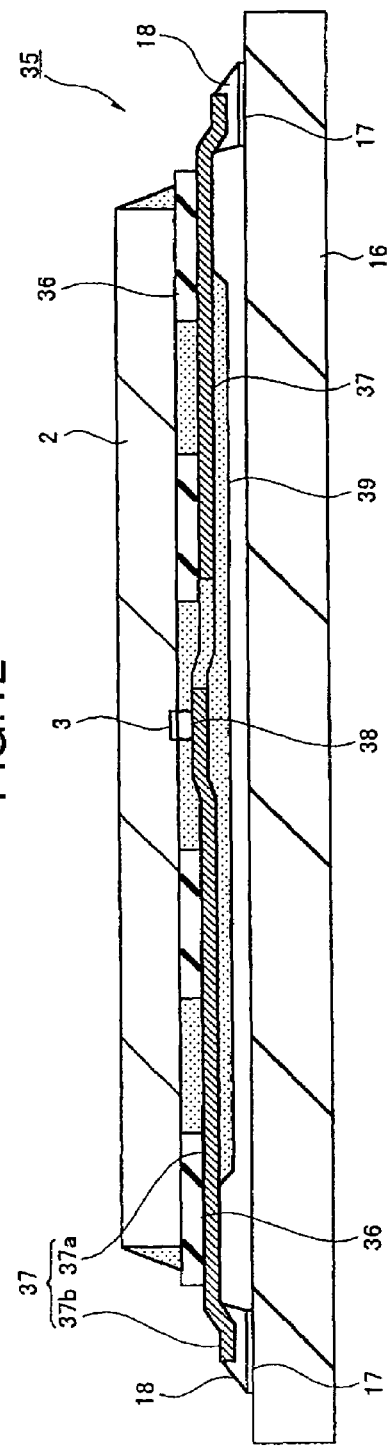

FIG.13
(a)
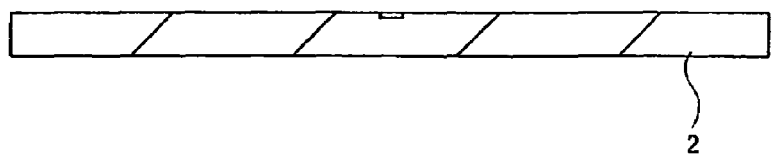
(b)
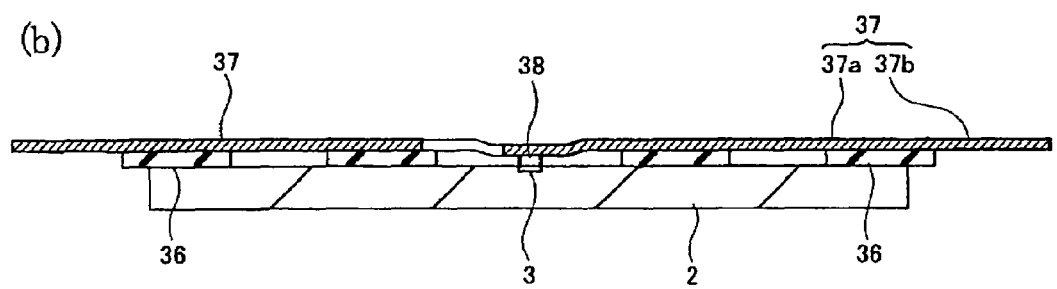
(c)
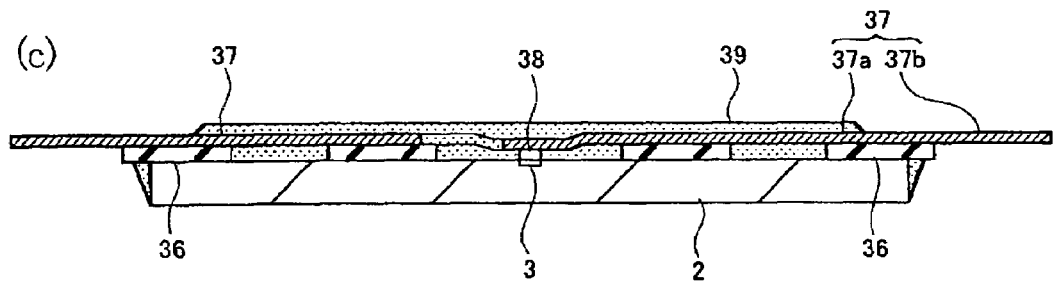
(d)
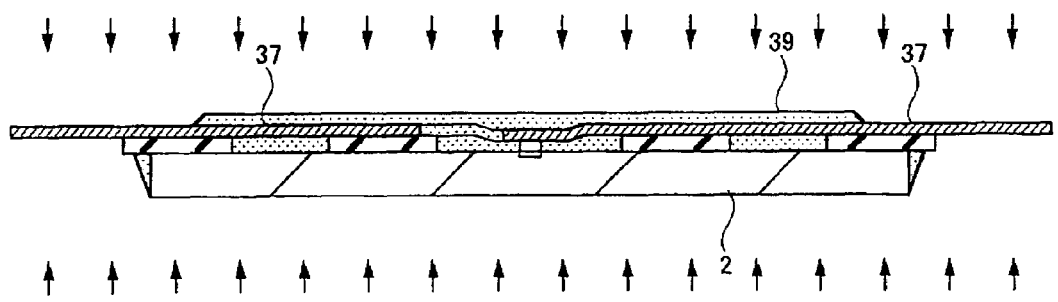

FIG. 16
(a)
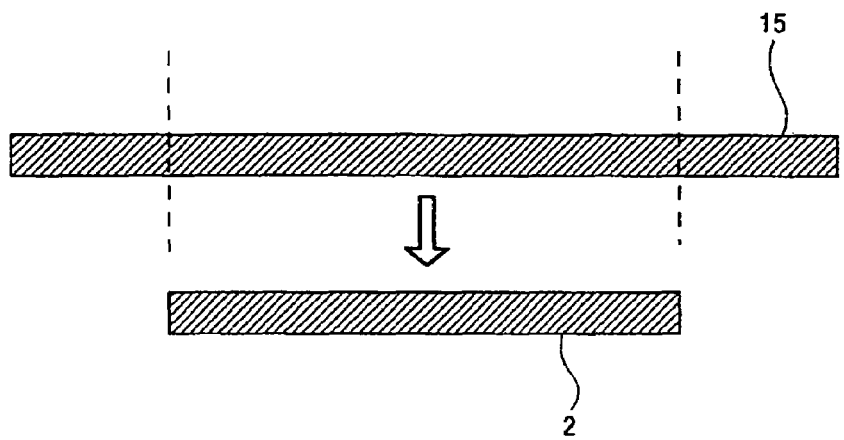
(b)
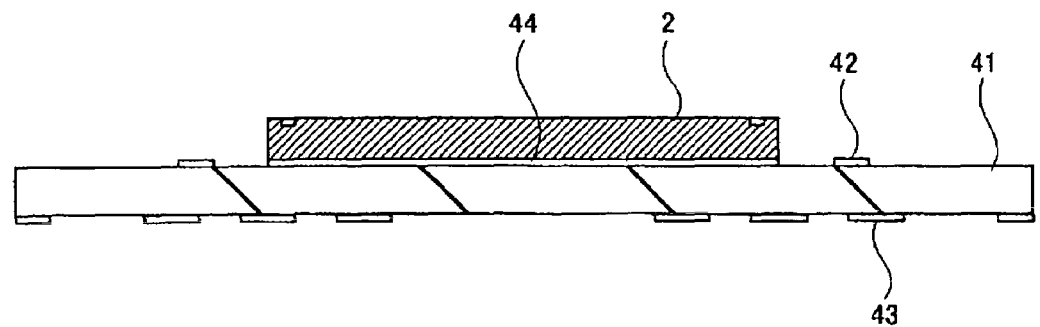
(c)
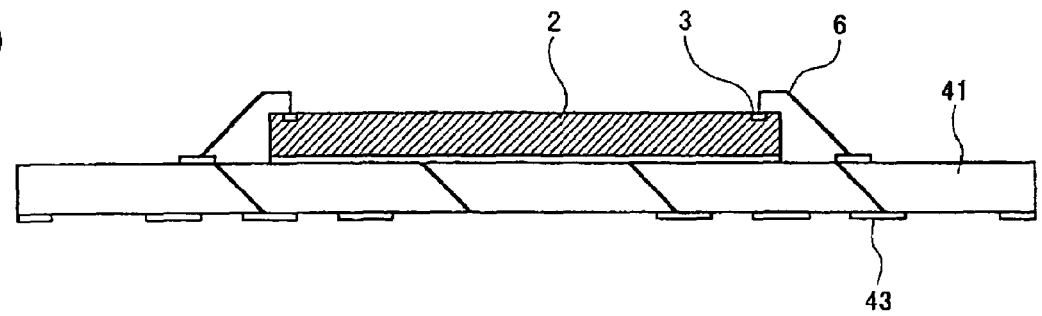

FIG.17
(a)
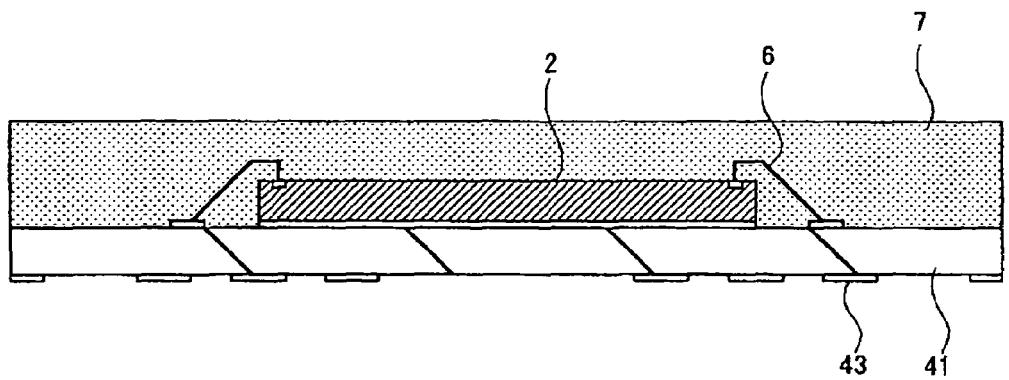
(b)
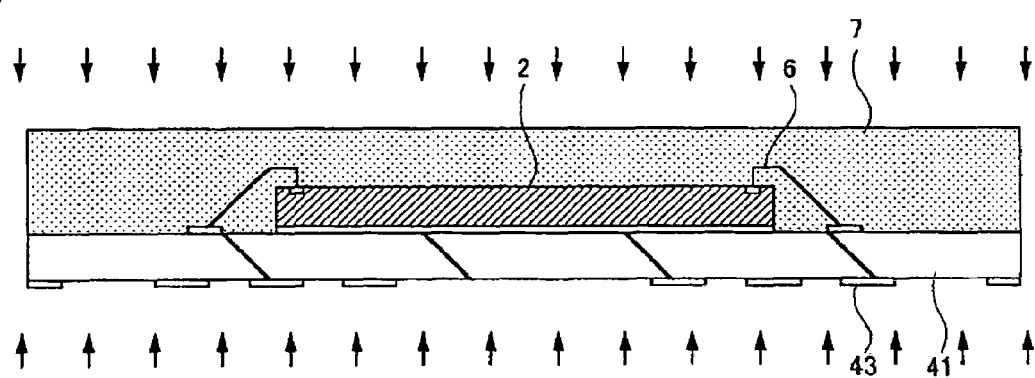
(c)
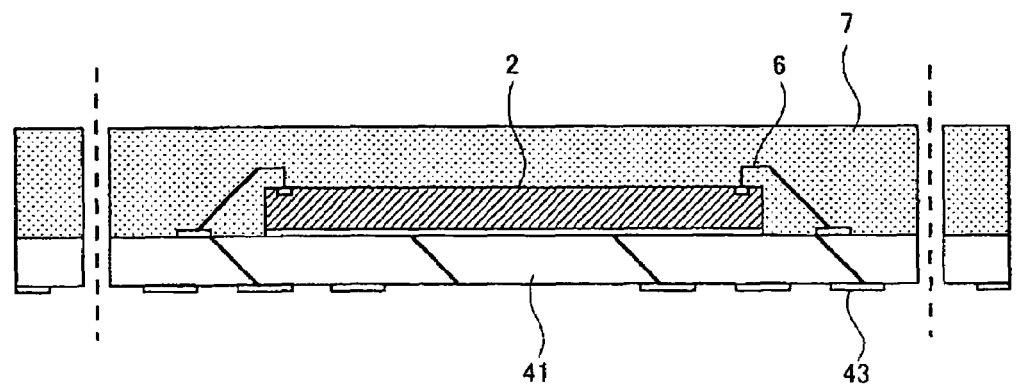

METHOD FOR MANUFACTURING SEMICONDUCTOR DEVICE

TECHNICAL FIELD

The present invention relates to a producing method for a semiconductor device, particularly a technique effective for being applied to a semiconductor device in which a semiconductor chip is sealed with a resin.

BACKGROUND TECHNIQUE

As a semiconductor device in which a semiconductor chip including an integrated circuit is sealed with a resin, for example, a so-called TSOP (Thin Small Outline Package) type semiconductor device is known. As this TSOP type semiconductor device, a device in which an LOC (Lead On Chip) structure which is prevented from including a die pad (in other words, tab) of a lead frame and is applicable to also a large size semiconductor chip is used, is known.

The TSOP type semiconductor device with LOC structure includes a semiconductor chip, a plurality of leads adhesively fixed to a circuit forming surface of a main surface of the semiconductor chip through an insulating film (an insulating tape), a plurality of bonding wires (metallic thin wires) connecting electrically respective electrodes on the circuit forming surface of the semiconductor chip to the leads respectively, and a resin sealing body for sealing the semiconductor chip, the leads, the bonding wires and so forth. The leads include inner leads arranged in the resin sealing body and outer leads extending from the inner leads and arranged at the outside of the resin sealing body. The outer leads are bent to have a gull-wing shape as a lead shape of surface mounting type.

In a production of the TSOP type semiconductor device with LOC structure, firstly a semiconductor wafer including a plurality of chip formed areas is divided by dicing to the semiconductor chips, and subsequently the semiconductor chips is fixed to a lead frame. The semiconductor chip is fixed to the lead frame by adhering the inner leads of the lead of the lead frame to the circuit forming surface of the semiconductor chip through the insulating film.

Subsequently, the electrodes of the circuit forming surface of the semiconductor chip are electrically connected to the inner leads of the lead of the lead frame by the bonding wires, and subsequently, the semiconductor chip, the inner leads of the lead, the bonding wires, suspending leads and so forth are sealed with the resin to form the resin sealing body. The sealing with the resin is performed through a transfer-molding process preferable for mass production. For example, an epoxy type thermosetting resin including a phenol type setting agent, a silicone rubber, a filler and so forth is used as the resin. A resin sealing temperature (temperature at which the thermosetting is performed) is about 180° C.

Subsequently, a post cure of about 5 hours is performed at a temperature substantially equal to the resin sealing temperature to stabilize the curing reaction of the thermosetting resin.

Subsequently, the outer leads of the lead are separated from the frame body of the lead frame, unrequired portions are removed from the lead frame, subsequently the outer leads of the lead is formed to have a predetermined shape (for example, the gull wing shape), and subsequently the suspending leads are separated from the frame body of the lead frame. Finally, an external appearance of a package including the outer leads and the resin sealing body is inspected and a characteristic thereof as a finished product is inspected to judge whether or not it is good. In the inspection of the characteristic thereof, for example, an aging test of about 16 hours at 90° C. is performed. The aging test is a screening test in which the circuit is operated at an operating condition (with an additional load) more severe than an operating condition of an user to accelerate an occurrence of defect which will be elicited in the operation of the user so that a defective one is eliminated at an initial step before being supplied to the user.

In the above production, since the sealing (molding) with the resin is performed at a high temperature, the resin contracts in a cooling step to a room temperature so that a compressive stress is generally generated in the semiconductor chip.

DISCLOSURE OF THE INVENTION

The TSOP type semiconductor device is mounted on a wiring substrate (mounting substrate) of PCB (Printed Circuit Board) or the like during a production of an electronic apparatus. In the mounting of the TSOP type semiconductor device, the outer leads arranged at the outside of the resin sealing body and the electrodes (parts of the wires) of the wiring substrate are connected by melting solder.

In this mounting step, since the TSOP type semiconductor device is heated to a high temperature, a curing reaction of the thermosetting resin sealing the semiconductor chip is accelerated to increase a contraction amount of the thermosetting resin during the mounting step. When the contraction amount of the thermosetting resin is increased, the compression stress applied to the semiconductor chip is increased so that a characteristic of an integrated circuit mounted on the semiconductor chip is changed by piezo electric effect. Since the characteristic of the integrated circuit influences a characteristic of the electronic apparatus forming the circuit performance, the characteristic of the electronic apparatus is changed in accordance with the change of the characteristic of the integrated circuit. Therefore, the curing reaction of the thermosetting resin sealing the semiconductor chip during the mounting step should be restrained as far as possible.

Further, in the TSOP type semiconductor device with LOC structure, since the semiconductor chip (Si) and the lead (alloy of Fe type of Cu type) different in material are adhered and sealed with the resin, the package is asymmetrical in the thickness direction. In this asymmetrical structure, the package curves over the whole thereof by a difference in contraction amount among the semiconductor chip, the lead and the resins above and under them. Therefore, when the contraction amount of the resin increases during the mounting step, the curvature amount increases while the stress concentrated at the solder joint is increased, so that a reliability of the solder joint decreases significantly.

Conventionally, for joining the semiconductor device and the substrate, Sn-37 [wt %]Pb composition solder is mainly used, but in recent years, use of Pb is restricted for environmental protection, and a substitution by Pb-free solder has been developed for the mounting of the semiconductor device. Since Sn—Ag—Cu type solder mainly used as the Pb-free solder has a melting point higher than that of the conventional Sn-37Pb composition solder, the mounting temperature increases from the conventional 220-240° C. to about 260° C. by maximum 40° C. Since the curing reaction of the resin is further enhanced by the increase of the mounting temperature, the increase of the contraction amount of the thermosetting resin during the soldering mount step of the Pb-free solder mounting device becomes a problem more important than that of the Sn-37Pb solder mounting device.

Another object of the invention is to provide a technique capable of restraining the change of characteristic of the semiconductor device during the mounting step.

Another object of the invention is to provide a technique capable of improving an yield of production of the electronic apparatus.

The above and other objects and features of the invention will be clarified in the description of the present specification and the attached drawings.

Summary of the typical one of the invention disclosed in the present application is briefly explained as follows.

(1) In a production of a semiconductor device, after (a) step in which a thermosetting resin is heated to be cured so that a semiconductor chip is sealed with a resin, (b) step in which the thermosetting resin is baked by a temperature higher than that of the (a) step for resin sealing is included.

(2) In the production of the semiconductor device described in said means (1), the (b) step is performed in the temperature of 220-260° C.

(3) In the production of the semiconductor device described in said means (1), a step (c) in which a characteristic of the semiconductor chip is inspected after the step (b) is further included.

(4) In a production of a semiconductor device, step (a) in which the thermosetting resin is heated to be cured so that the semiconductor chip is sealed with the resin, step (b) in which the thermosetting resin is baked by a temperature not more than the temperature of resin sealing in the step (a) or a temperature equal to or not more than the temperature of resin sealing, and step (c) in which the thermosetting resin is baked after the step (b) by a temperature more than the temperature of resin sealing in the step (a), are included.

(5) In the production of the semiconductor device described in the means (4), the step (c) is performed in the temperature of 220-260° C.

(6) In the production of the semiconductor device described in the means (4), step (d) in which the characteristic of the semiconductor device is inspected after the step (c), is further included.

(7) In a production of a semiconductor device, a step in which the semiconductor device is prepared by (a) step in which the thermosetting resin is heated to be cured so that the semiconductor chip is sealed with the resin, (b) step in which the thermosetting resin is baked after the step (a) by a temperature more than the temperature of resin sealing in the step (a), and step (c) in which the characteristic of the semiconductor chip is inspected after the step (b), and A step in which the semiconductor device is mounted on a mounting substrate by a soldering mounting.

(8) In the production of the semiconductor device described in the means (7), the soldering mounting is performed by using a solder of Pb-free composition.

BRIEF EXPLANATION OF THE DRAWINGS

FIG. 5 is a schematic cross sectional view showing the production process of the semiconductor device as the first embodiment of the invention.

FIG. 6 is a schematic cross sectional view showing the production process of the semiconductor device to be continued from FIG. 5.

FIG. 11 is a schematic cross sectional view showing briefly a structure of a semiconductor device as a third embodiment of the invention.

FIG. 12 is a schematic cross sectional view showing briefly a structure of an electronic apparatus including the semiconductor device as the third embodiment of the invention.

FIG. 13 is a schematic cross sectional view showing a production process of the semiconductor device as the third embodiment of the invention.

FIG. 16 is a schematic cross sectional view showing a production process of the semiconductor device as the fourth embodiment of the invention.

FIG. 17 is a schematic cross sectional view showing the production process of the semiconductor device to be continued from FIG. 16.

BEST MODE FOR BRINGING THE INVENTION TO EFFECT

Hereafter, the embodiments of the invention will be explained in detail with making reference to the drawings. Incidentally, in all of the drawings for explaining the embodiments of the invention, elements of the same function have the same denoting mark to eliminate repeating explanation.

Embodiment 1

Figure 1:
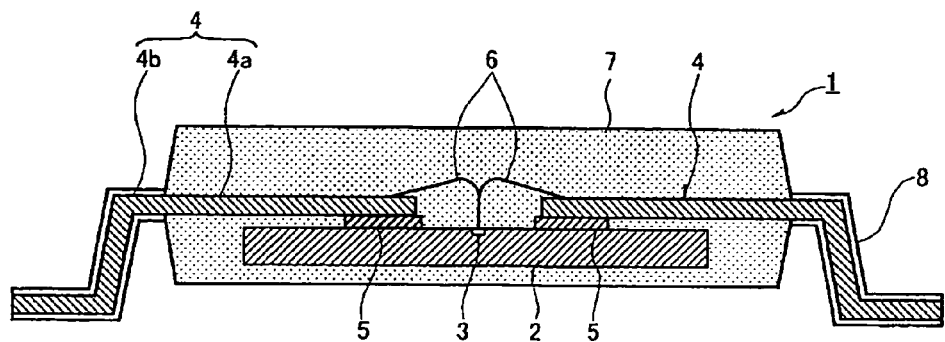
FIG. 1 is a schematic cross sectional view showing briefly a structure of a semiconductor device as a first embodiment of the invention.

FIG. 1 is a schematic cross sectional view showing briefly a structure of a semiconductor device as a first embodiment of the invention.

Figure 2:
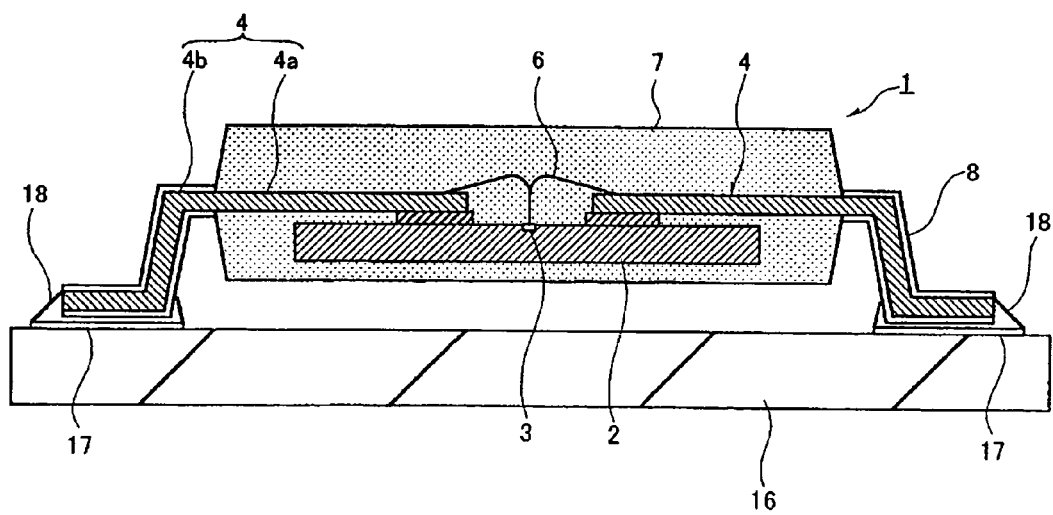
FIG. 2 is a schematic cross sectional view showing briefly a structure of an electronic apparatus including the semiconductor device as the first embodiment of the invention.

FIG. 2 is a schematic cross sectional view showing briefly a structure of an electronic apparatus including the semiconductor device as the first embodiment of the invention.

As shown in FIG. 1, a semiconductor device 1 of the first embodiment includes mainly a semiconductor chip 2, first and second lead groups having leads 4, a plurality of bonding wires (metallic wires) 6, a resin sealing body 7 and so forth. The semiconductor chip 2, the first and second lead groups having leads 4, the plurality of bonding wires and so forth are sealed with a resin of the resin sealing body 7.

The semiconductor chip 2 includes a circuit forming surface (main surface) and a reverse surface opposite to each other in its thickness direction, and has a square shape along a plane perpendicular to the thickness direction, for example, a rectangular shape. Further, the semiconductor chip 2 includes mainly a semiconductor substrate, a plurality of transistor elements formed on a main surface of the semiconductor substrate, an insulating layer on the main surface of the semiconductor substrate, a multi-layered wiring layer of stacked wiring layers, and a surface protection film (final protection film) covering the multi-layered wiring layer, although these should not be necessarily included. The semiconductor substrate is made of, for example, a monocrystal silicon. The insulating layer is made of, for example, a silicon-oxide film. The wiring layer is made of a metallic film of, for example, Aluminum (Al), aluminum alloy, Copper (Cu), copper alloy or the like. The surface protection film is made of a multi-layered film including stacked organic insulating film and inorganic insulating film of, for example, silicon-oxide film, silicon-nitride film or the like.

The semiconductor chip 2 includes, for example, 256 mega-bits DDRSDRAM (Double Data Rate Synchronous Dynamic Random Access Memory) as an integrated circuit. This integrated circuit includes mainly transistor elements formed on the main surface of the semiconductor substrate, wires formed on the multi-layered wiring layer, and so forth.

A plurality of electrodes (bonding pads) are arranged on the circuit forming surface of the semiconductor chip 2. The plurality of electrodes 3 are formed on an uppermost wiring layer of the multi-layered wiring layer of the semiconductor chip 2, and exposed through bonding openings formed in the surface protection film of the semiconductor chip 2. In this embodiment, the plurality of electrodes 3 are arranged along a central axis of a longitudinal direction (longer side direction) of the main surface of the semiconductor chip 2.

The resin sealing body 7 has a main surface and a reverse surface (mounting surface) opposite to each other in its thickness direction, and has a square shape along a plane perpendicular to the thickness direction, for example, a rectangular shape in this embodiment.

The leads 4 of the first lead group are arranged along one of longer sides of the resin sealing body 7 opposite to each other, and the leads 4 of the second lead group are arranged along another one of the longer sides of the resin sealing body 7. The leads of the first and second lead group include inner lead portions 4a arranged in the resin sealing body 7 and outer leads portions 4b extending from the inner lead portions 4a to the outside of the resin sealing body 7 to extend between the inside and outside of the resin sealing body 7.

In the first and second lead groups, the inner lead portions 4a of the lead 4 are fixed with adhesive to the main surface of the semiconductor chip 2 through the insulating film 5, and electrically connected to the electrodes 3 of the semiconductor chip 2 through the bonding wires 6. That is, the TSOP type semiconductor device 1 of the first embodiment has LOC structure in which the leads 4 are arranged on the main surface of the semiconductor chip 2. For example, Au wires are used as the bonding wires 6. For example, a nail head bonding method including thermo compression bonding with ultrasonic vibration is used for connecting the wires.

In the first and second lead groups, the outer lead portions 4b of the lead 4 are bent to have, for example, a gull-wing shape as one of lead shapes of surface mounting type. Further, the outer lead portions 4b of the lead 4 are plated to have a metallic deposit layer (electrically conductive coating layer) 8 covering their surfaces. The metallic deposit layers 8 are arranged to improve an joining characteristic (conformability) with respect to a solder (joining member) used when the semiconductor device 1 is mounted on the wiring substrate through the solder. For example, when Sn-37[wt %] Pb composition solder is used, Sn—Pb composition metallic deposit layers or multi-layered metallic deposit layers of Ni/Pd/Au are used as the metallic deposit layers 8. Further, for example, when Pb-free solder is used, Sn—Bi composition metallic deposit layers or multi-layered metallic deposit layers of Ni/Pd/Au are used as the metallic deposit layers 8.

The TSOP type semiconductor device 1 as constructed as above is mounted on a wiring substrate 16 of PCB or the like in the production of the electronic apparatus, as shown in FIG. 2. The mounting of the semiconductor device 1 is performed by joining by the solder 18 the outer lead portions 4b arranged at the outside of the resin sealing body 7 with electrodes (joint portions as parts of wires) 17 of the wiring substrate 16.

Figure 3:
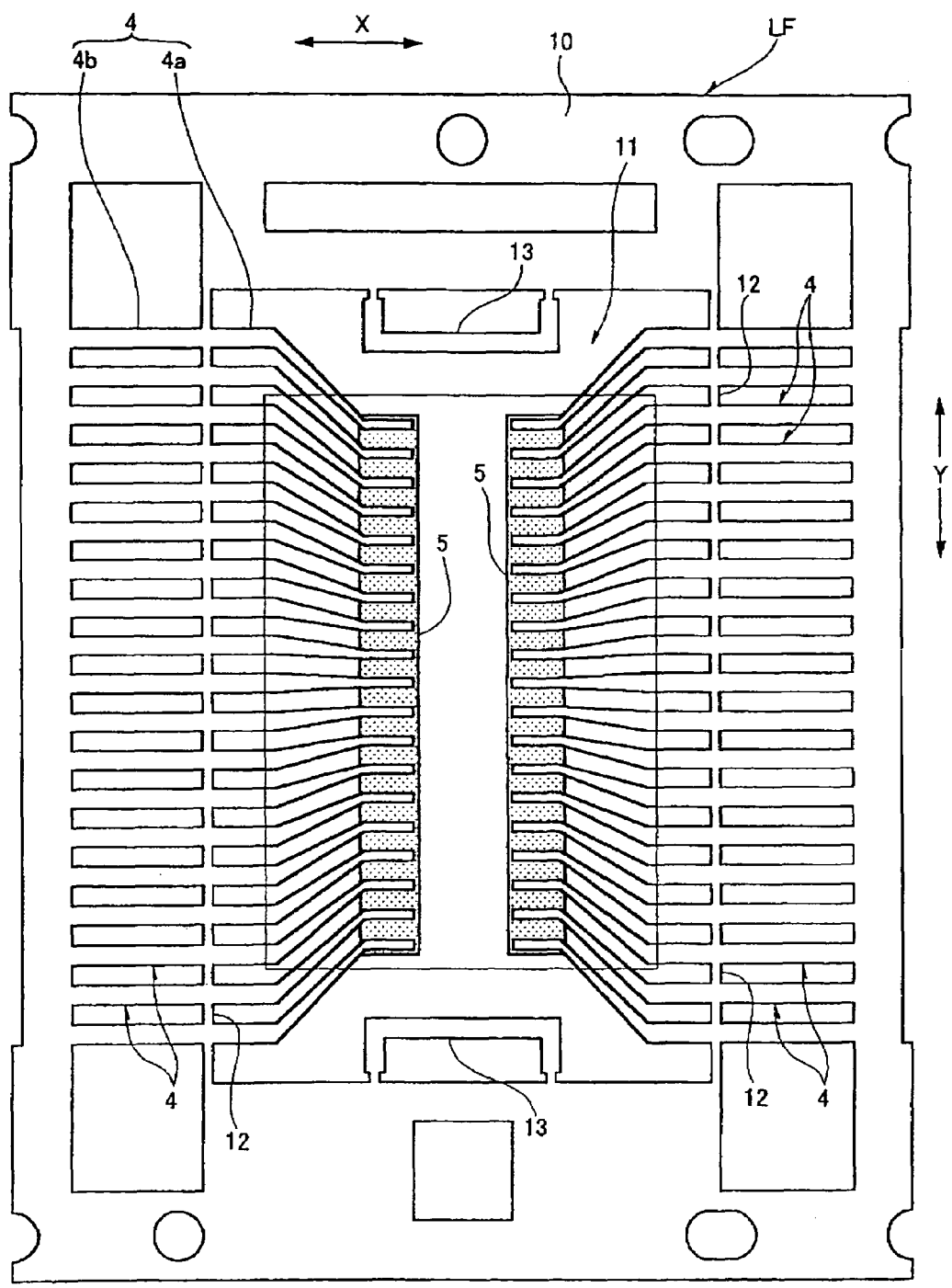
FIG. 3 is a schematic plan view showing briefly a structure of a lead frame to be used in a production of the semiconductor device as the first embodiment of the invention.

FIG. 3 is a schematic plan view showing briefly a structure of a lead frame to be used in a production of the semiconductor device as the first embodiment of the invention. Incidentally, the lead frame has actually a series of portions for respective products to improve a productivity, but in this case, one of the portions for the product is shown to be easily viewable.

As shown in FIG. 3, the lead frame LF has the first and second lead groups of the leads 4, two of the suspension leads 13 and so forth in a product forming portion 11 defined by the frame body 10. In this embodiment, the product forming portion 11 has a plane shape of, for example, rectangular shape.

The first and second lead groups are opposite to each other and separated from each other in an X direction (a shorter side direction of the product forming portion 11). Each of the leads 4 of the first and second lead groups is arranged along a Y direction (a longer side direction of the product forming portion 11) perpendicular to the X direction. In the first and second lead groups, the leads 4 adjacent to each other are connected by a tie bar 12. Further, at an end of each of the leads 4 (a front end of the inner lead portion 4a), the insulating film 5 extending along the longer side direction of the product forming portion 11 is adhered to a surface as a reverse surface of a wire connected surface. Further, another end of each of the leads 4 (a front end of the outer lead portion 4b) opposite to the end of each of the leads 4 is connected to the frame body 10.

The two suspension leads 13 are opposite to each other in the Y direction and separated from each other to be connected to the frame body 10.

The lead frame LF is formed by an etching treatment or press working is performed on a metallic plate made of an alloy material of, for example, Fe—Ni type or Cu type, to form a predetermined lead pattern, and thereafter adhering the insulating film 5 to the inner lead portions 4a of the leads 4.

Subsequently, the production of the semiconductor device 1 will be explained with using FIGS. 4-6.

Figure 4:
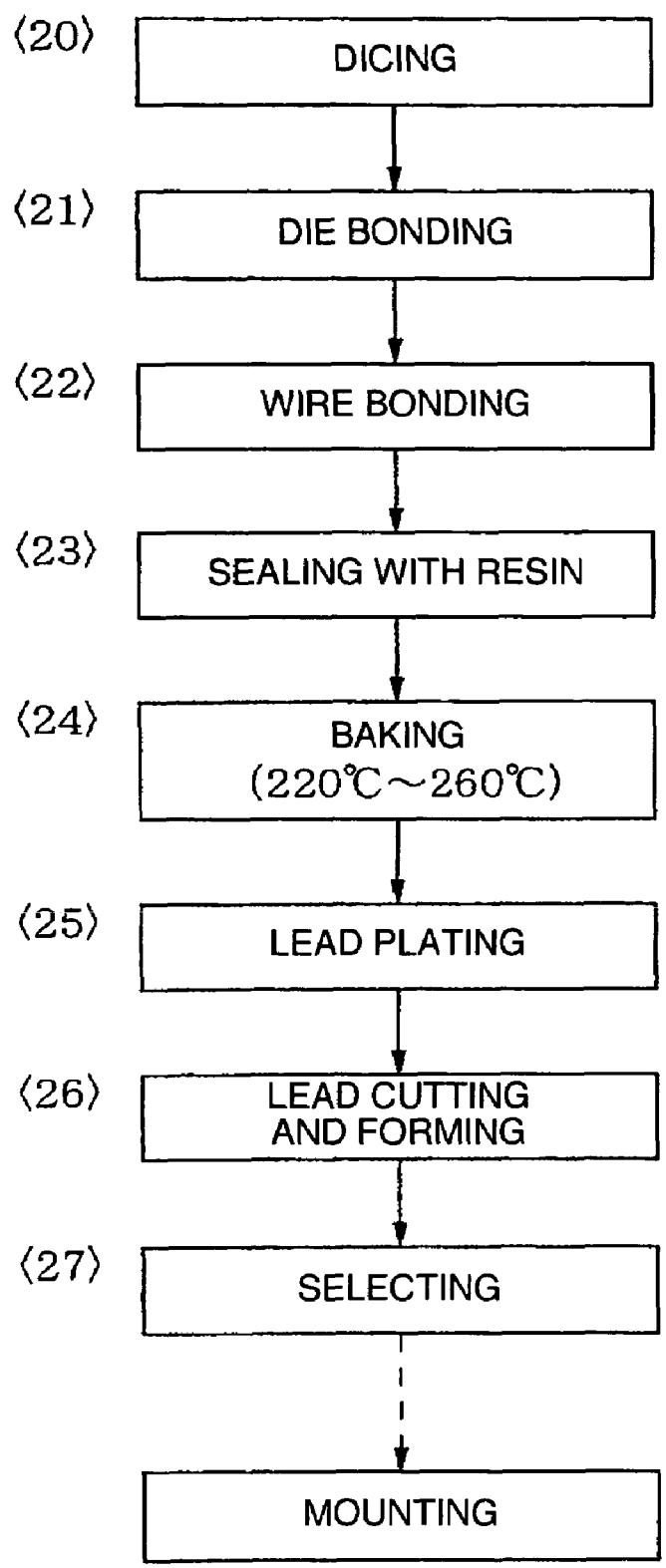
FIG. 4 is a flow chart showing a production process of the semiconductor device as the first embodiment of the invention.

FIG. 4 is a flow chart showing a production process of the semiconductor device as the first embodiment of the invention.

FIG. 5 is a schematic cross sectional view showing the production process of the semiconductor device as the first embodiment of the invention.

FIG. 6 is a schematic cross sectional view showing the production process of the semiconductor device to be continued from FIG. 5.

Firstly, as shown in FIG. 4<20> and FIG. 5(*a*), the semiconductor wafer 15 including a plurality of chip forming areas is divided by dicing to the semiconductor chips 2.

Subsequently, as shown in FIG. 4<21> and FIG. 5(*b*), the separated semiconductor chip 2 is fixed (die bonding) to the lead frame LF. The fixing of the semiconductor chip 2 to the lead frame LF is performed by adhering the inner lead portions 4*a* of the leads 4 of the lead frame LF to the circuit forming surface of the semiconductor chip 2 through the insulating film 5.

Subsequently, as shown in FIG. 4<22> and FIG. 5(*c*), the electrodes 3 of the semiconductor chip 2 and the inner lead portions 4*a* of the leads 4 of the lead frame LF are electrically connected (wire bonding) by the bonding wires 6.

Subsequently, as shown in FIG. 4<23> and FIG. 5(*d*), the semiconductor chip 2, the inner lead portions 4*a* of the leads 4, the bonding wires 6, the suspension leads 13 and so for the are sealed with the resin to form the resin sealing body 7. The sealing with the resin is performed by a transfer molding process suitable for mass production. As the resin, for example which may be replaced by the other, an epoxy type thermosetting resin including phenol curing agent, silicone rubber, filler and so forth is used to decrease a stress. In the transfer-molding process, a pot, a runner, a mold including an inflow gate and a cavity, and so forth are used so that the thermosetting resin is injected into the cavity from the pot through the runner and the inflow gate to seal with the resin (form the sealing body). A resin sealing temperature (temperature for thermally curing) is about 180° C. That is, the semiconductor chip 2, the inner lead portions 4*a* of the lead 4, the bonding wires 6, the suspension leads 13 and so forth are sealed with the resin by thermally curing the thermosetting resin.

Subsequently, as shown in FIG. 4<24> and FIG. 6(*a*), the resin sealing body is baked under 220-260° C. to stabilize the curing reaction of the thermosetting resin. A time period of the baking is selected in accordance with a curing degree of the thermosetting resin.

Subsequently, after a temperature of the resin sealing body 7 is returned to the normal temperature, the lead is plated as shown in FIG. 4<25> to form a plated layer 8 on the outer lead portions 4*b* arranged at the outside of the resin sealing body 7 as shown in FIG. 6(*b*).

Subsequently, as shown in FIG. 4<26>, cutting/forming of the leads is performed. This cutting/forming includes a step in which the outer lead portions 4*b* of the leads are cut off from the frame body 10 of the lead frame LF, a step in which a needless portion is cut off from the lead frame LF, a step in which the outer lead portions 4*b* separated from the frame body 10 are bent to have, for example, a gull-wing shape as one of lead shapes of surface mounting type, and a step in which front ends of the bent outer lead portions 4*b* are cut to be aligned with respect to each other as shown in FIG. 6(*c*). By this process, the semiconductor device as shown in FIG. 1 is substantially completed.

Subsequently, an outer appearance of the package including the outer lead portions 4*a* and the resin sealing body 7 is inspected while inspecting a characteristic thereof as a product to check the quality thereof (make reference to FIG. 4<27>). In the inspection of the characteristic, a characteristic of the integrated circuit mounted on the semiconductor chip 2 is inspected after, for example, an aging test of about 16 hours under 90° C. In this process, the semiconductor devices of deteriorated performance may be classified to be shipped separately in accordance with respective performances.

The semiconductor device 1 as produced above is mounted on the wiring substrate 16 of PCB or the like in an assembling process of an electronic apparatus such as a personal computer or the like or an electronic apparatus such as a memory module or the like, as shown in FIG. 2.

Figure 7:
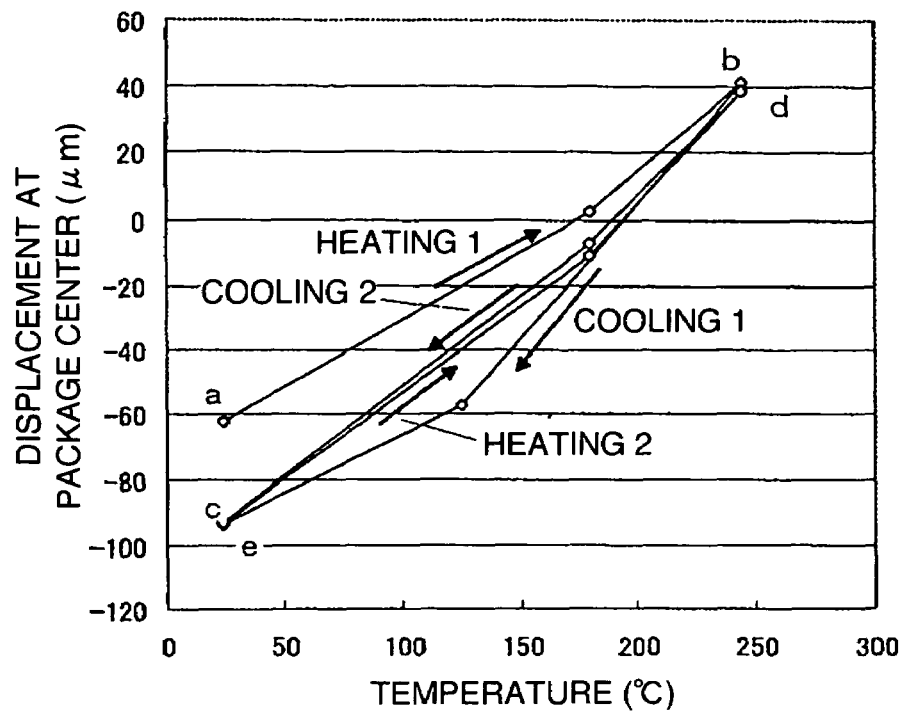
FIG. 7 is a diagram showing a measuring result of a curvature of a package at each temperature of the semiconductor device as the first embodiment of the invention.

FIG. 7 is a diagram showing a measuring result of a warpage of a package at each temperature of the semiconductor device as the first embodiment of the invention.

As shown in FIG. 7, the package after the resin sealing has a warpage generated by the molding and caused by the asymmetry thereof in the thickness direction (a). This package is heated to 245° C. (heating 1: a→b), and subsequently cooled to the room temperature (cooling 1: b→c), so that the warpage amount increases (c). But, if it is again heated to 245° C. (heating 2: c→d) and cooled (cooling 2: d→e), the warpage of the package under the room temperature does not substantially change in comparison with the warpage after the first heating. Therefore, when the curing reaction is once stabilized by the high temperature, the repeated heating thereafter does not cause an increase of the warpage of the package so that a compressing stress applied to the semiconductor chip 2 is not increased.

Therefore, in the production of the semiconductor device 1, as shown in FIG. 4, by performing the step <24> in the thermosetting resin is baked by the temperature higher than the resin sealing temperature in the resin sealing step <23> after the step <23> in which the thermosetting resin is thermally cured to seal the semiconductor chip 2 with the resin, in the mounting step in which the semiconductor device 1 is mounted on the wiring substrate 16 through the solder, since the curing reaction of the thermosetting resin with which the semiconductor chip 2 is sealed is stabilized, the increase of the compression stress applied to the semiconductor chip 2 is restrained. Therefore, the change in characteristic of the integrated circuit mounted on the semiconductor chip 2, that is, the change in characteristic of the semiconductor device during the mounting process is restrained.

Further, since the increase in warpage of the package during the mounting process is restrained and the increase in stress concentrated at a solder joint portion (a portion at which the electrode 17 of the wiring substrate 16 and the lead 4 of the semiconductor device 1 are joined with the solder 18) is restrained, a reliability of the solder joint portion is improved.

Since the mounting temperature at which the mounting with the solder is performed changes in accordance with a kind of the solder to be used, it is preferable for the temperature at which the thermosetting resin with which the semiconductor chip 2 is sealed is baked to be selected in accordance with the mounting temperature at which the semiconductor device 1 is mounted on the wiring substrate 16. For example, since the mounting temperature is 220-240° C. when Sn-37Pb composition solder is used for the mounting with the solder, it is preferable for the baking temperature of the thermosetting resin to be made at the same degree as this temperature of the mounting. Further, since the mounting temperature is 240-260° C. when Pb-free solder of Sn—Ag—Cu type is used for the mounting with the solder, it is preferable for the baking temperature of the thermosetting resin to be made at the same degree as this temperature of the mounting.

Since a melting temperature of the solder of Sn—Ag—Cu type as mainly used as the Pb-free solder is higher than that of the Sn-37Pb composition solder, the mounting temperature is increased from 220-240° C. to 240-260° C. by maximum 40° C. Therefore, the present invention is effective for the mounting of the semiconductor device 1 with the Pb-free solder.

In the production of the semiconductor device 1, when the thermosetting resin is baked by the temperature higher than the resin sealing temperature in the resin sealing step <23> after the step <23> in which the thermosetting resin is thermally cured to seal the semiconductor chip 2 with the resin, the change in characteristic of the semiconductor device 1 during the mounting process is restrained, but since the curing reaction of the thermosetting resin is developed by the baking, the compression stress applied to the semiconductor chip 2 is increased so that the characteristic of the integrated circuit mounted on the semiconductor chip 2 is changed. On the other hand, during the production of the semiconductor device, the outer appearance of the package including the outer lead portions 4b and the resin sealing body 7 is inspected while the characteristic of the integrated circuit mounted on the semiconductor chip 2, that is, the characteristic of the product is inspected to check the quality thereof.

Therefore, in the production of the semiconductor device 1, by baking the thermosetting resin by the temperature higher than the resin sealing temperature in the resin sealing step to apply thereto a thermal career equivalent to the temperature for mounting with the solder after the resin sealing step <23> in which the thermosetting resin is thermally cured to seal the semiconductor chip 2 with the resin and before the characteristic inspection step in which the characteristic of the semiconductor chip 2 is inspected, the semiconductor devices 1 whose semiconductor chips have the characteristics changed significantly by the baking can be eliminated or classified to be shipped separately in accordance with respective performances.

In this embodiment, the semiconductor chip 2 includes DDRSDRAM as the integrated circuit. Since this integrated circuit generally has a redundancy, in the semiconductor device 1 with the deterioration of the performance reliability detected in the characteristic inspection step for the semiconductor device, a circuit construction may be changed to be made usable by using an electric fuse incorporated in the circuit to satisfy a predetermined performance. At this time, the semiconductor device 1 made usable is again checked regarding the performance reliability thereof and shipped. Further, the semiconductor devices 1 may be classified to be shipped separately in accordance with respective performances.

The semiconductor device 1 is mounted on the wiring substrate 16 together with other electronic elements in the production of the electronic apparatus. Therefore, in the production of the electronic apparatus, by mounting on the wiring substrate 16 with the solder the semiconductor device 1 as produced through the above producing method, the change of the characteristic of the semiconductor device 1 during the mounting process is restrained and the reliability of the solder joint (the portion at which the electrode of the wiring substrate 16 and the lead 4 of the semiconductor device 1 are joint with the solder 18) caused by the warpage of the package is improved. Further, the change of the characteristic of the semiconductor device 1 during the mounting process is decreased to improve a process yield of the electronic apparatus.

Incidentally, although in the embodiment 1, the explanation is done with reference to the DDRSDRAM as an example of the integrated circuit mounted on the semiconductor chip 2, the same effect is obtainable in a memory circuit such as SRAM 'Static Random Access Memory), EEPROM (Electrically Erasable Programmable Read Only Memory) as so-called flash memory or the like, a controller circuit, a logic circuit or a system circuit including these.

Figure 8:
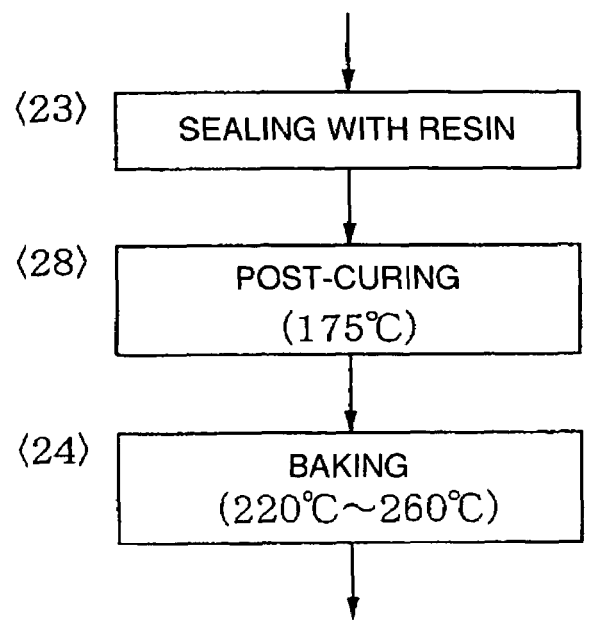
FIG. 8 is a flow chart snowing a production process of a semiconductor device as a modified embodiment of the first embodiment of the invention.

FIG. 8 is a flow chart showing a production process of a semiconductor device as a modified embodiment of the first embodiment of the invention.

Although in the embodiment 1, the example in which a post curing step is eliminated as shown in FIG. 4 is explained, as shown in FIG. 8, the post curing step <28> of about 5 hours in the temperature of the same degree as the resin sealing temperature in the resin sealing step <23> after step <23> in which the thermosetting resin is thermally cured to seal the semiconductor chip 2 with the resin and a subsequent baking step <24> of short time period in a temperature higher than the resin sealing temperature of the resin sealing step <23> may be performed. In this case, the same effect as the first embodiment is also obtainable.

Incidentally, as a substitute for the baking step <24>, in a performance reliability inspection such as the aging test or the like, after an initial temperature for the performance inspection is applied at 220-260° C. and for dozens of seconds—few minutes, the performance reliability inspection may be done to check the quality.

Embodiment 2

In this embodiment, an example in which the mold is done at single surface side (main surface) of the lead frame to form the resin sealing body and expose the leads as the outer electrode terminals at a surface of the resin sealing body for a non-lead type semiconductor device of the package structure, so that the present invention is applied to SON (Small Outline Non-Leaded Package) type semiconductor device in which the leads are exposed at edges of both sides of the surface of the resin sealing body, is explained.

Figure 9:
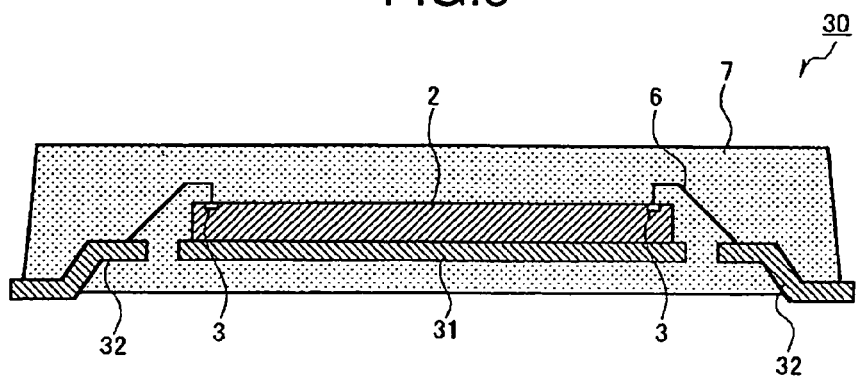
FIG. 9 is a schematic cross sectional view showing briefly a structure of the semiconductor device as a second embodiment of the invention.

FIG. 9 is a schematic cross sectional view showing briefly a structure of the semiconductor device as a second embodiment of the invention.

Figure 10:
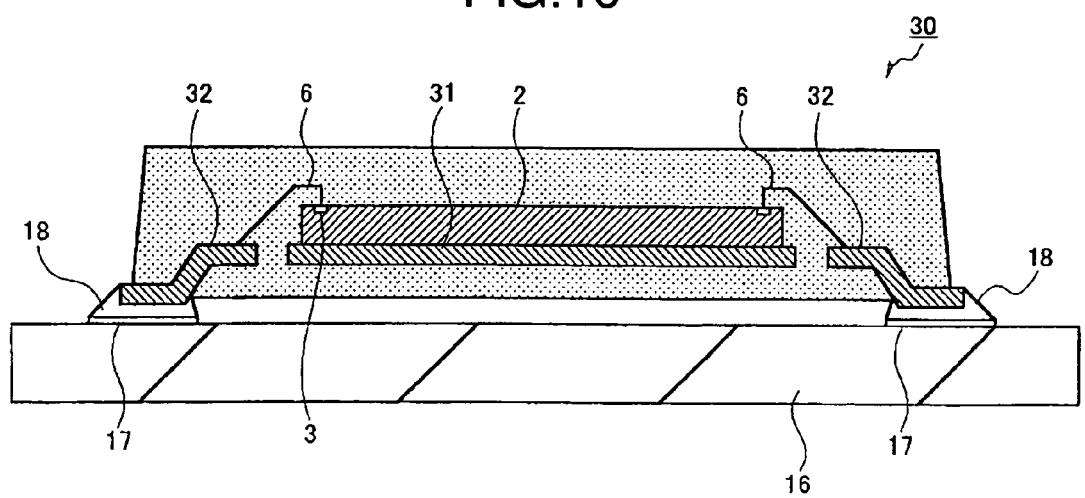
FIG. 10 is a schematic cross sectional view showing briefly a structure of an electronic apparatus including the semiconductor device as the second embodiment of the invention.

FIG. 10 is a schematic cross sectional view showing briefly a structure of an electronic apparatus including the semiconductor device as the second embodiment of the invention.

As shown in FIG. 9, a semiconductor device 30 of this embodiment 2 has mainly die pads 31, a semiconductor chip 2 mounted on the die pads 31, a plurality of leads 32 arranged around the semiconductor chip 2, a plurality of the bonding wires 6 connecting respectively the electrodes 3 of the semiconductor chip 2 and the leads 32, the resin sealing body 7 and so forth. The die pads 31, the semiconductor chip 2, the leads 32, the bonding wires 6 and so forth are sealed with the resin of the resin sealing body 7.

The electrodes and the leads 32 are arranged along respective sides of the semiconductor chip 2 opposite to each other. Parts of the leads 32 are exposed at a reverse surface (mounting surface) of the semiconductor body 7 to form the outer electrode terminals.

The SON type semiconductor device 30 as constructed above is mounted in the production of the electronic apparatus on the wiring substrate 16 of PCB or the like as shown in FIG. 10. The mounting of the semiconductor device 30 is performed by connecting the parts of the leads 32 exposed at the reverse surface of the resin sealing body 7 and the electrodes 17 (connecting portions as parts of the wires) of the wiring substrate 16.

The resin sealing body 7 of the semiconductor device 30 is formed by the transfer-molding process in which the thermosetting resin is used. Therefore, in the production of the semiconductor device 30, as shown in FIG. 4, by performing after the step <23> in which the thermosetting resin is thermally cured to seal the semiconductor chip with the resin, the step <24> in which the thermosetting resin is baked by the temperature higher than the resin sealing temperature in the resin sealing step <23>, the same effect as the embodiment 1 is obtainable in the embodiment 2.

Further, in the production of the semiconductor device 30, by baking the thermosetting resin at the temperature higher than the resin sealing temperature of the resin sealing step after the resin sealing step <23> in which the thermosetting resin is thermally cured to seal the semiconductor chip 2 with the resin and before the characteristic inspection step in which the characteristic of the semiconductor chip 2 is inspected, the same effect as the first embodiment is obtainable in the second embodiment.

Further, in the production of the electronic apparatus, by mounting through the solder on the wiring substrate 16 the semiconductor device 30 as produced through the above production process, the same effect as the first embodiment is obtainable in the second embodiment.

Although in the TSOP type semiconductor device 1 as described above, the stress generated by the warpage of the package and concentrated at the solder joint portions can be relaxed by the deformation of the outer leads portions 4b, since the parts of the leads 32 are exposed at the reverse surface of the resin sealing body 7, in the SON type semiconductor device 30, it is difficult for the stress generated by the warpage of the package and concentrated at the solder joint portions to be relaxed. Therefore, the present invention has a great effect for the non-lead type semiconductor device of the package structure in which the leads as the outer electrode terminals are exposed at the surface of the resin sealing body.

Incidentally, although the SON type semiconductor device is explained in relation to the embodiment 2, the present invention can be applied to QFN (Quad Flat Non-Leaded Package) type semiconductor device in which the leads are exposed at four sides of the surface of the resin sealing body of rectangular shape.

Further, as shown in FIG. 8, the step <24> in which the thermosetting resin is baked by the temperature higher than the resin sealing temperature in the resin sealing step <23> may be performed after a post-curing step <28> at the temperature substantially equal to the resin sealing temperature of the resin sealing step <23> and for about five hours is performed after the step <23> in which the thermosetting resin is thermally cured to seal the semiconductor chip 2 with the resin.

Embodiment 3

In the embodiment 3, an example in which the present invention is applied to TCP type semiconductor device is explained. A producing technique of the TCP type semiconductor device is called as TAB (Tape Automated Bonding) technique, in a view point of assembling.

FIG. 11 is a schematic cross sectional view showing briefly a structure of a semiconductor device as a third embodiment of the invention.

FIG. 12 is a schematic cross sectional view showing briefly a structure of an electronic apparatus including the semiconductor device as the third embodiment of the invention.

As shown in FIG. 11, the semiconductor device 35 of the embodiment 3 has mainly the semiconductor chip 2, the insulating film 36 adhered to the circuit forming surface of the semiconductor chip 2, the leads 37 adhered to the insulating film 36, the bumps 38 connecting respectively the electrodes 3 of the semiconductor chip 2 and the leads 32, the sealing resin and so forth.

The electrodes 3 of the semiconductor chip 2 are arranged along a central axis of a longitudinal direction (a longer side direction) of the main surface of the semiconductor chip 2. Each of the leads 37 has inner lead portions 37a and outer lead portions 37b extending from the inner lead portions 37a to extend between inside and outside of the semiconductor chip 2. The inner lead portions 37a are adhered through the insulating film 36 to the circuit forming surface of the semiconductor chip 2, and the outer lead portions 37b are bent to have, for example, the gull-wing shape as one of the shapes of the surface mounting type lead.

The semiconductor chip 2, the insulating film 36, the inner lead portions 37a of each of the leads 37, the bumps 38 and so forth are sealed with the resin.

The TCP type semiconductor device 35 as constructed above is mounted on the wiring substrate 16 of PCB or the like in the production of the electronic apparatus as shown in FIG. 12. The mounting of the semiconductor device 35 is performed by joining the outer lead portions 37b of the leads 37 and the electrodes 17 (the parts of the wires as the connecting portions) of the wiring substrate 16 with the solder.

Subsequently, the production of the semiconductor device 35 is explained with making reference to FIG. 13.

FIG. 13 is a schematic cross sectional view showing a production process of the semiconductor device as the third embodiment of the invention.

At first, the semiconductor wafer 15 on which the plurality of the chip forming areas are formed is diced to form the semiconductor chips 2 as shown in FIG. 13(a), and subsequently, as shown in FIG. 13(b), the semiconductor chip 2 is adhesively fixed to the insulating film 36 onto which the leads 37 are adhesively fixed.

Subsequently, the electrodes 3 of the semiconductor chip 2 and front ends of the inner lead portions 37a of the leads 37 are bonded with thermo compression through the bumps therebetween so that the electrodes 3 of the semiconductor chip 2 and the leads 37 are electrically connected.

Subsequently, the circuit forming surface of the semiconductor chip 2 is coated with a sealing resin 39 of the thermosetting resin as, for example, an epoxy type resin including an organic solvent, and the sealing resin 39 is thermally cured to seal the semiconductor chip 2, the insulating film 36, the inner lead portions 37a of each of the leads 37, the bumps 38 and so forth with the sealing resin 38.

Subsequently, as shown in FIG. 13(c), the sealing resin 39 is baked at 220-260° C. to stabilize the curing reaction of the sealing resin 39.

Subsequently, after the temperature of the sealing resin 39 is returned to the normal temperature, unrequired parts of the leads 37 are cut off, and the outer lead portions 37b of the leads 37 are bent to have a predetermined shape (for example, the gull-wing shape).

Thereafter, the outer appearance is inspected, and the performance reliability test, for example, of 90° C. and for about 16 hours is done to check the quality. In this step, the semiconductor devices 35 of the deteriorated performance may be shipped separately in accordance with respective performances.

The semiconductor device 35 as produced above is mounted on the wiring substrate 16 of PCB or the like in an assembling step of the electric apparatus such as a personal computer or the like or in an assembling step of the electronic device such as a memory module or the like, as shown in FIG. 12.

As described above, in the production of the semiconductor device 35, as shown in FIG. 4, by performing, after the step <23> in which the thermosetting resin is thermally cured to seal the semiconductor chip 2 with the resin, the step <24> in which the thermosetting resin is baked in the temperature higher than the resin sealing temperature in the resin sealing step <23>, the same effect as the embodiment 1 is also obtainable in the embodiment 3.

Further, in the production of the semiconductor device 35, by performing, after the step <23> in which the thermosetting resin is thermally cured to seal the semiconductor chip 2 with the resin and before the characteristic inspection step in which the characteristic of the semiconductor chip 2 is inspected, the step <24> in which the thermosetting resin is baked in the temperature higher than the resin sealing temperature in the resin sealing step <23>, the same effect as the embodiment 1 is also obtainable in the embodiment 3.

Further, in the production of the electric apparatus, by mounting onto the wiring substrate with the solder the semiconductor device as produced through the above producing process, the same effect as the embodiment 1 is also obtainable in the embodiment 3.

Embodiment 4

In the embodiment 4, an example in which the present invention is applied to a BGA type semiconductor device of face-up type, is explained.

Figure 14:
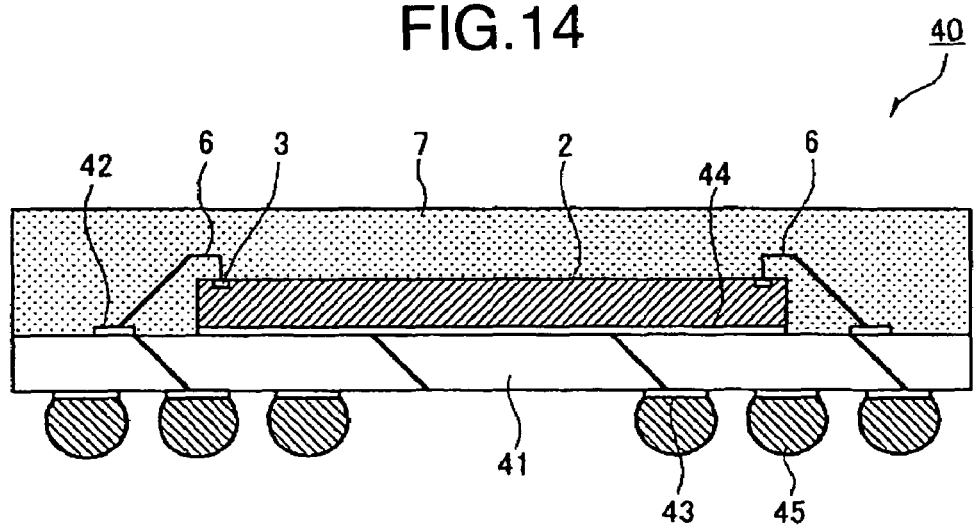
FIG. 14 is a schematic cross sectional view showing briefly a structure of a semiconductor device as a fourth embodiment of the invention.

FIG. 14 is a schematic cross sectional view showing briefly a structure of a semiconductor device as a fourth embodiment of the invention.

Figure 15:
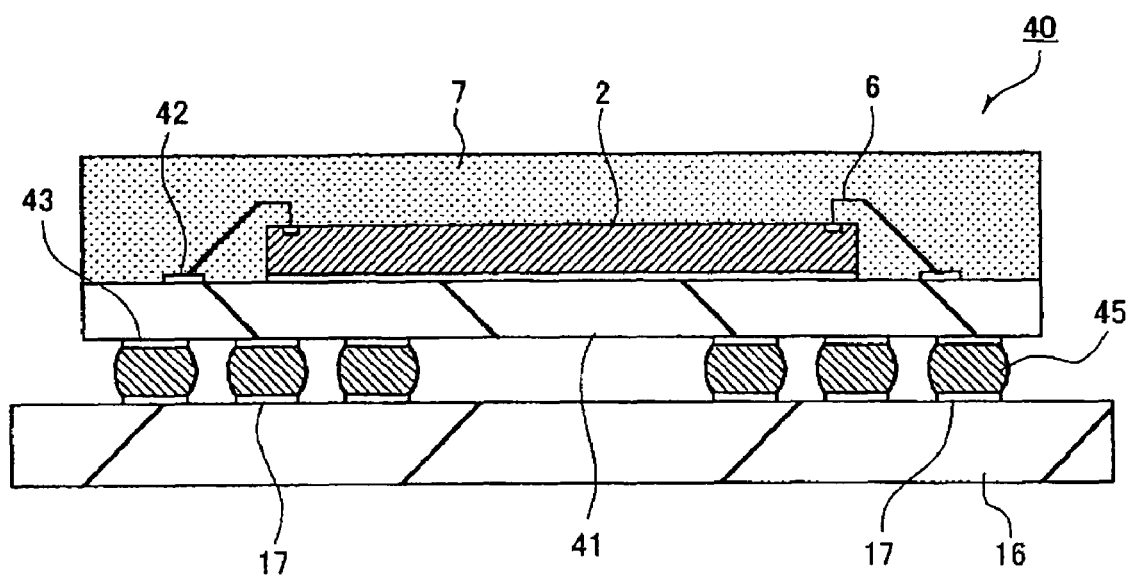
FIG. 15 is a schematic cross sectional view showing briefly a structure of an electronic apparatus including the semiconductor device as the fourth embodiment of the invention.

FIG. 15 is a schematic cross sectional view showing briefly a structure of an electronic apparatus including the semiconductor device as the fourth embodiment of the invention.

As shown in FIG. 14, a semiconductor device 40 of the embodiment 4 has a base substrate (wiring substrate) 41 so-called as an interposer, the semiconductor device 2 adhered by an adhesive member 44 to a main surface of the base substrate 41 opposed to a reverse surface thereof, the bonding wires 6 connecting respectively electrically the electrodes 3 arranged at the circuit forming surface of the semiconductor chip 2 and electrodes 43 arranged on the main surface of the base substrate 41, solder bumps 45 fixed respectively to electrodes 43 arranged on the reverse surface of the base substrate 41, the resin sealing body 7 and so forth. The semiconductor chip 2, the bonding wires 6 and so forth are sealed by the resin sealing body 7 formed on the main surface side of the base substrate 41.

The BGA type semiconductor device 40 as constructed above is mounted, in the production of the electronic apparatus, on the wiring substrate 16 of PCB or the like, as shown in FIG. 15. The mounting of the semiconductor device 40 is performed by joining the solder bumps 45 arranged on the reverse surface of the base substrate 41 and the electrodes 17 (the parts of the wires as the connection portions) of the wiring substrate 16.

FIG. 16 is a schematic cross sectional view showing a production process of the semiconductor device as the fourth embodiment of the invention.

FIG. 17 is a schematic cross sectional view showing the production process of the semiconductor device to be continued from FIG. 16.

At first, as shown in FIG. 16(a), the semiconductor wafer 15 on which the chip forming areas are formed is divided by dicing to the semiconductor chips 2.

Subsequently, as shown in FIG. 16(b), the separated semiconductor chip 2 is adhesively fixed (die bonding) to the main surface of the base substrate 41 through the adhesive member 44. The adhesive fixing of the semiconductor chip 2 is performed while the reverse surface of the semiconductor chip 2 and the main surface of the base substrate 41 face to each other.

Subsequently, as shown in FIG. 16(c), the electrodes 3 of the semiconductor chip 2 and the electrodes 42 of the base substrate 41 are electrically connected (wire bonding) by the bonding wires 6.

Subsequently, as shown in FIG. 17(a), the semiconductor chip 2, the bonding wires 6 and so forth are sealed with the resin to form the resin sealing body 7. The sealing with the resin is performed through the transfer molding process with the single side molding. As the resin, for example, the thermosetting resin of epoxy type including the curing agent of phenol type, silicone rubber, filler and so forth for decreasing the stress, is used, although the resin is not limited to this. The resin sealing temperature (temperature for thermally curing) is about 180° C. That is, the semiconductor chip 2, the inner lead portions 4a of the lead 4, the bonding wires 6, the suspension leads 13 and so forth are sealed with the resin by thermally curing the thermosetting resin.

Subsequently, as shown in FIG. 17(b), the resin sealing body 7 is baked at 220-260° C. to stabilize the curing reaction of the thermosetting resin. A time period of the baking is chosen in accordance with a curing degree of the thermosetting resin. Incidentally, when the base substrate 41 is made of a resin type material, there is an effect of that the base substrate 41 is also stabilized by the baking.

Subsequently, after the temperature of the resin sealing body 7 is returned to the normal temperature, as shown in FIG. 17(c), the base substrate 41 and the resin sealing body 7 are cut and thereafter the solder bumps 45 are formed on the electrodes 43 of the base substrate 41. By this step, the semiconductor device 40 as shown in FIG. 15 is completed substantially.

Hereafter, the inspection of the outer appearance of the package including the base substrate 41 and the resin sealing body 7, and the characteristic of the product is inspected to check the quality. In the inspection of the characteristic, after the aging test, for example, at 90° C. and for about 16 hours, the characteristic of the integrated circuit mounted on the semiconductor chip 2 is inspected. In this step, the semiconductor devices 40 of the deteriorated characteristic may be shipped separately in accordance with respective performances.

The solder bumps can be formed by various processes. For example, solder balls are supplied onto the electrodes 43 of the base substrate 41, and subsequently the solder balls are melted to form the solder bumps 45. In this case, since the curing reaction of the resin sealing body 7 is not necessarily stabilized in the melting step of the solder balls although the resin sealing body 7 is exposed to the melting temperature of the solder balls, in the production of the BGA type semiconductor device 40, as shown in FIG. 4, the step <24> in which the thermosetting resin is baked at the temperature higher than the resin sealing temperature at the resin sealing step <23> is preferably done after the step <23> in which the thermosetting resin is thermally cured to seal the semiconductor chip 2 with the resin.

Further, as another process for forming the solder bumps 45, for example, the solder balls are supplied onto the electrodes 43 of the base substrate 41 through solder paste members, and subsequently, the solder paste members are melted to form the solder bumps 45. Also in this case, since the curing reaction of the resin sealing body 7 is not necessarily stabilized in the melting step of the solder paste members, the step <24> in which the thermosetting resin is baked at the temperature higher than the resin sealing temperature at the resin sealing step <23> is preferably done after the step <23> in which the thermosetting resin is thermally cured to seal the semiconductor chip 2 with the resin.

Embodiment 5

In the embodiment 5, an example in which the present invention is applied to BGA type semiconductor device of MCM (Multi Chip Module) type, is explained.

Figure 18:
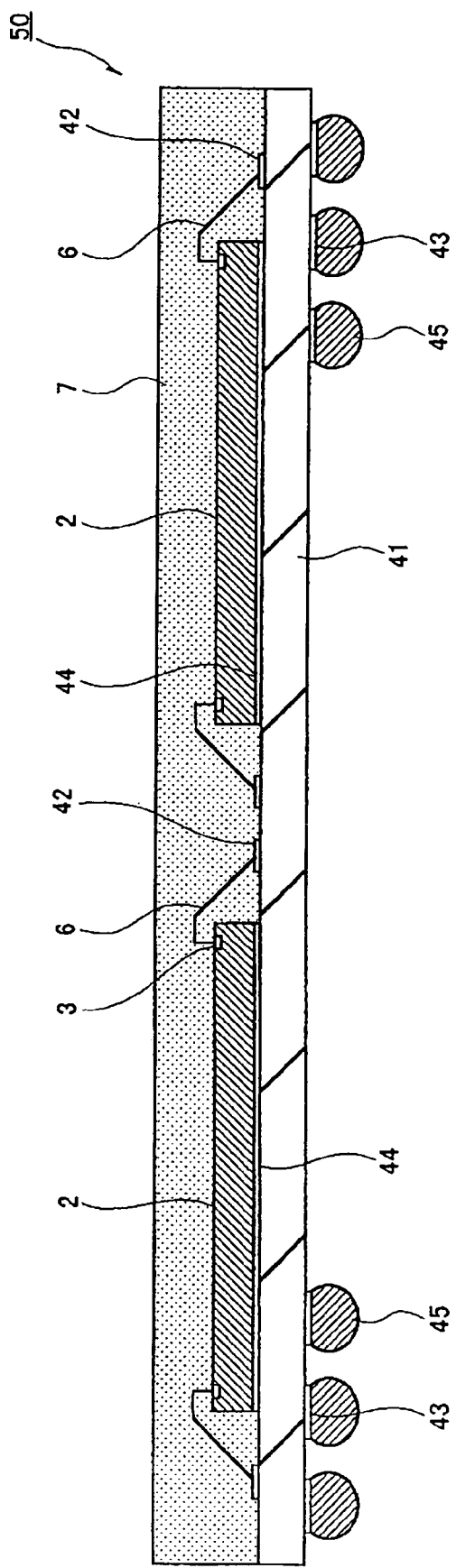
FIG. 18 is a schematic cross sectional view showing briefly a structure of a semiconductor device as a fifth embodiment of the invention.

FIG. 18 is a schematic cross sectional view showing briefly a structure of a semiconductor device as a fifth embodiment of the invention.

As shown in FIG. 18, a semiconductor device 50 of the embodiment 5 has basically the same structure as the semiconductor device 40 of the embodiment 4 as described above, and a different point from the semiconductor device 40 is that two of the semiconductor chips 2 are mounted on the main surface of the base substrate 41.

Also in the production of this semiconductor device 50, as shown in FIG. 4, the step <24> in which the thermosetting resin is baked at the temperature higher than the resin sealing temperature at the resin sealing step <23> is preferably done after the step <23> in which the thermosetting resin is thermally cured to seal the semiconductor chip 2 with the resin.

In the above, the invention by the inventors is concretely explained on the basis of the embodiments, on the other hand, the invention is not limited to the above embodiments, and can be modified variously within a scope within which its substance is kept, as a matter of course.

For example, the invention can be applied to an LGA (land Grid Array) type semiconductor device in which the semiconductor chip is mounted on the main surface of the wiring substrate, lands as terminals for connection to the outside are arranged at the reverse surface of the wiring substrate, and the semiconductor chip is sealed with the thermosetting resin.

Further, the invention can be applied to the LGA semiconductor device and BGA type semiconductor device of facedown structure in which the semiconductor chip is mounted on the main surface of the wiring substrate through protruding electrodes and a sealing resin of the thermosetting resin fills between the wiring substrate and the semiconductor chip.

The effects obtained by typical ones of the invention disclosed by the present application are briefly explained as follows.

According to the invention, the change in characteristic of the semiconductor device in the mounting step can be restrained.

According to the invention, an improvement in process yield of producing the electronic apparatus is obtainable.

INDUSTRIAL APPLICABILITY

As described above, the invention is effective for the production of the semiconductor device in which the semiconductor chip is sealed with the thermosetting resin.

Further, the invention is effective for the production of the electronic apparatus including the semiconductor device in which the semiconductor chip is sealed with the thermosetting resin.

The invention claimed is:

1. A method of making a semiconductor device to be soldered with an Sn—Ag—Cu type solder to a substrate, the method comprising:
    (a) sealing the semiconductor device in a package by surrounding it with thermosetting epoxy resin and thermally curing the resin at a first temperature;
    (b) baking the thermosetting epoxy resin at a second temperature not higher than the first temperature;
    (c) further baking the thermosetting epoxy resin at a third temperature higher than the first temperature, wherein the third temperature is between about 220° C. and about 260° C.; and
    (d) inspecting the semiconductor device.

2. A method as in claim 1 wherein step (b) advances curing of the thermo setting epoxy resin.

3. A method as in claim 1 wherein the semiconductor device comprises an integrated circuit.

4. A method as in claim 1 wherein step (a) includes a transfer molding process.

5. A method as in claim 1 wherein step (a) includes a potting process.

6. A method as in claim 1 wherein a conductive lead is adhesively affixed to a main surface of the semiconductor device.

7. A method as in claim 6 wherein the conductive lead is adhesively affixed to a peripheral portion of the main surface of the semiconductor device.

8. A method as in claim 7 wherein an electrode of the semiconductor device is electrically connected to the conductive lead.

* * * * *